(12) United States Patent
Rasmussen et al.

(10) Patent No.: US 10,225,954 B2
(45) Date of Patent: Mar. 5, 2019

(54) THERMAL TRANSFER BETWEEN ELECTRONIC DEVICE AND CASE

(71) Applicant: Apple Inc., Cupertino, CA (US)

(72) Inventors: Timothy J. Rasmussen, San Jose, CA (US); Ibuki Kamei, San Jose, CA (US); Ian P. Colahan, Menlo Park, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 15/714,844

(22) Filed: Sep. 25, 2017

(65) Prior Publication Data

US 2018/0092241 A1    Mar. 29, 2018

Related U.S. Application Data

(60) Provisional application No. 62/399,295, filed on Sep. 23, 2016.

(51) Int. Cl.

| | | |
|---|---|---|
| *H05K 7/20* | (2006.01) | |
| *H05K 5/00* | (2006.01) | |
| *H05K 1/02* | (2006.01) | |
| *H01R 12/70* | (2011.01) | |
| *H01R 33/945* | (2006.01) | |
| *H01R 24/60* | (2011.01) | |
| *G06F 1/20* | (2006.01) | |
| *H04N 5/225* | (2006.01) | |

(52) U.S. Cl.
CPC ............. *H05K 7/2039* (2013.01); *G06F 1/20* (2013.01); *H01R 12/7076* (2013.01); *H01R 24/60* (2013.01); *H01R 33/945* (2013.01); *H05K 1/028* (2013.01); *H05K 5/0026* (2013.01); *H05K 5/0086* (2013.01); *H05K 7/20445* (2013.01); *H04N 5/2257* (2013.01)

(58) Field of Classification Search
CPC ....... H01L 2023/405; H01L 2023/4062; H01L 2023/4087; H01L 23/40; G06F 1/206; G06F 1/20; H05K 7/2039; H05K 5/0217; H05K 3/284; H05K 5/0086; H05K 5/069; H05K 7/20409; H05K 7/20436; H05K 7/20963
See application file for complete search history.

(56) References Cited

U.S. PATENT DOCUMENTS

| 7,486,517 B2* | 2/2009 | Aapro ................... H04M 1/026 165/104.33 |
| 2007/0263352 A1* | 11/2007 | Jones ................. H05K 7/20418 361/688 |
| 2008/0037771 A1* | 2/2008 | Black .................. H04M 1/0266 379/433.01 |

(Continued)

*Primary Examiner* — James Wu
*Assistant Examiner* — Michael A Matey
(74) *Attorney, Agent, or Firm* — Kilpatrick Townsend & Stockton LLP (57) ABSTRACT

An electronic device case with a thermal dissipation system is disclosed. The electronic device case is configured to draw heat out of an electronic device disposed therein. The electronic device case includes a connector plug configured to engage a connector receptacle of the electronic device. The thermal dissipation system includes a thermally conductive pathway that both transfers heat to a heat spreader and electrically couples the electronic device to an electrical component within the electronic device case.

20 Claims, 6 Drawing Sheets

(56) References Cited

U.S. PATENT DOCUMENTS

| | | | |
|---|---|---|---|
| 2008/0101026 A1* | 5/2008 | Ali | G06F 1/203 |
| | | | 361/708 |
| 2010/0072952 A1* | 3/2010 | Nakajima | H04B 1/036 |
| | | | 320/150 |
| 2012/0056789 A1* | 3/2012 | Sohn | H01Q 1/242 |
| | | | 343/702 |
| 2015/0068935 A1* | 3/2015 | Kay | A45C 13/36 |
| | | | 206/320 |
| 2015/0194833 A1* | 7/2015 | Fathollahi | H02J 7/0044 |
| | | | 320/114 |
| 2015/0326702 A1* | 11/2015 | Ames | H04M 1/03 |
| | | | 455/556.1 |
| 2015/0334870 A1* | 11/2015 | Feng | H05K 7/2039 |
| | | | 235/462.21 |
| 2016/0216734 A1* | 7/2016 | Lin | G06F 1/1632 |
| 2017/0281044 A1* | 10/2017 | Ahn | A61B 5/0022 |

* cited by examiner

THERMAL TRANSFER BETWEEN ELECTRONIC DEVICE AND CASE

CROSS-REFERENCE TO RELATED CASES

This application claims priority to provisional patent application 62/399,295 under 35 USC 119(e), the contents of which are incorporated by reference in their entirety and for all purposes.

FIELD

This disclosure applies generally to electronic device cases. In particular, an electronic device case with an integrated heat dissipation system is described.

BACKGROUND

Protective cases having various electronic features have become more common in recent years. For example, a battery case allows an electronic device connected thereto to operate for a substantially greater amount of time. Unfortunately, protective cases can negatively affect the ability of the electronic device to dissipate heat by reducing the efficiency of convective heat dissipation. For this reason, a mechanism for improving the thermal dissipation of the protective case is desirable.

SUMMARY

This disclosure describes various embodiments that relate to a battery case for an electronic device.

An electronic device case is disclosed and includes the following: a bottom wall and sidewalls that cooperate to define a recess suitable for receiving an electronic device; an electrical component embedded within the bottom wall; a connector plug protruding from one of the sidewalls and into the recess, the connector plug being configured to establish a communication channel between the electronic device and the electrical component; a heat-spreading component embedded within the bottom wall and configured to distribute heat received from the connector plug across the bottom wall; and a data connector assembly electrically coupling the connector plug to the electrical component, the data connector assembly comprising: a thermally conductive substrate having a first end in thermally conductive contact with the connector plug and a second end opposite the first end thermally coupled to the heat-spreading component.

Another electronic device case is disclosed and includes the following: a bottom wall and sidewalls that cooperate to define a recess suitable for receiving an electronic device; a battery embedded within the bottom wall; a connector plug protruding from one of the sidewalls and into the recess, the connector plug being configured to electrically couple the electronic device and the battery; a heat-spreading component embedded within the bottom wall and configured to distribute heat received from the connector plug across the bottom wall; and a flexible circuit extending from the connector plug to the heat-spreading component and from the heat-spreading component to the battery, the flexible circuit configured to transfer heat received at the connector plug to the heat-spreading component and deliver power from the battery to the electronic device.

Another electronic device case is disclosed and includes the following: a bottom wall and sidewalls that cooperate to define a recess suitable for receiving an electronic device; a battery embedded within the bottom wall; a connector plug protruding from one of the sidewalls and into the recess, the connector plug being configured to electrically couple the electronic device and the battery; a heat-spreading component embedded within the bottom wall and configured to distribute heat received from the connector plug across the bottom wall; and a data connector assembly electrically coupling the connector plug to the battery, the data connector assembly comprising: a rigid printed circuit (PCB) disposed within the connector plug, and a flexible circuit having a first portion disposed within the rigid PCB a second portion thermally coupled to the heat-spreading component and a third portion electrically coupled to the battery.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Electronic devices typically generate heat when performing computations or carrying out actions requested by a user. In demanding circumstances, the electronic device may have to enter a lower power mode in order to avoid an overheating condition. In some embodiments, the lower power mode can involve a lower display brightness and/or a lower operating frequency for a processor of the electronic device. For small form-factor computing devices, a heat dissipation system responsible for dissipating the heat often relies upon spreading the heat over an exterior surface of the electronic device. Unfortunately, placing the electronic device in a protective case can compromise the efficiency of a heat dissipation system configured to operate in this manner. For example, a protective case formed from insulating materials can trap heat that would normally be dissipated by convection. This can result in the electronic device having to shift into a lower power mode earlier to avoid an overheating condition.

One solution to this problem is to incorporate a heat-spreading device into the protective case. When the protective case is configured to electrically couple with the electronic device using a protruding connector, the protruding connector on the protective case can be thermally coupled with a connector receptacle of the electronic device. By thermally coupling a portion of the protruding connector with a heat-spreading device, heat from the connector receptacle can be received and spread across the protective case in order to dissipate heat more efficiently.

In some embodiments, the electronic device can be designed specifically to dissipate heat to the protruding connector. For example, the electronic device can have an internal thermally conductive pathway for transferring heat from heat emitting components within the electronic device to the connector receptacle.

In some embodiments, other accessory types can be utilized that are configured to draw heat out of an electronic device by way of the connector receptacle of the electronic device. Some examples include electronic device docks and game controllers configured to dock with the electronic device.

These and other embodiments are discussed below with reference to FIGS. 1-4; however, those skilled in the art will readily appreciate that the detailed description given herein with respect to these figures is for explanatory purposes only and should not be construed as limiting.

Figure 1A:
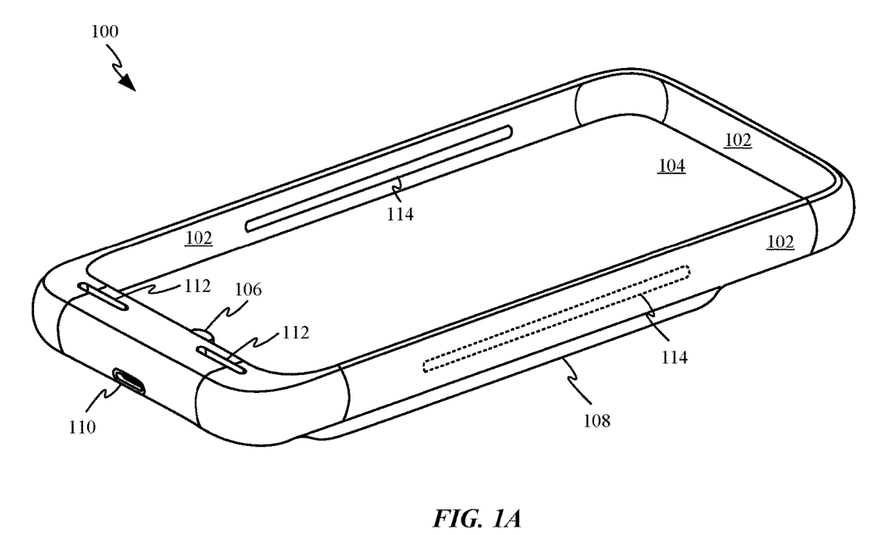
FIG. 1A shows a perspective view of a electronic device case.

FIG. 1A shows a perspective view of an electronic device case 100 that includes sidewalls 102 that cooperate to define a recess 104 sized to receive an electronic device. Electronic device case 100 also includes connector plug 106 having a hollow body that protrudes into recess 104. Connector plug 106 can be configured to enable communication and/or power transfer between the electronic device and electronic device case 100. Connector plug can take many different forms. For example, connector plug 106 can take the form of a USB® plug, a Lightning® plug or another small form-factor data plug. In some embodiments, the electronic device can be configured to power electronic components within electronic device case 100. In some embodiments, electronic device case 100 includes protrusion 108, which can be configured to accommodate electrical components supporting the operation of electronic device case 100. For example, a battery could be positioned within rear protrusion 108. The battery can be configured to provide power to the electronic device. Alternatively, memory modules can be positioned within protrusion 108. Protrusion 108 could also include an auxiliary camera module. The camera module could be configured to transfer any images or video taken to the electronic device using the electronic connection established by connector plug 106.

FIG. 1A also shows an external power receptacle 110. External power receptacle 110 can be configured to power electronic device case 100 and/or an electronic device disposed within electronic device case 100. Electronic device case 100 can also include audio ports 112 configured to allow audio waves to exit and leave from one end of the electronic device. In some embodiments, electronic device case 100 includes thermally conductive strips 114 embedded within sidewalls 102. When the electronic device is positioned within recess 104, thermally conductive strips 114 can be configured to press against an exterior surface of the electronic device. Thermally conductive strips 114 can be thermally coupled to a heat-spreading component disposed within sidewalls 102 so that the heat received can be spread evenly across sidewalls 102 and/or transferred to a rear surface of electronic device case 100.

Figure 1B:
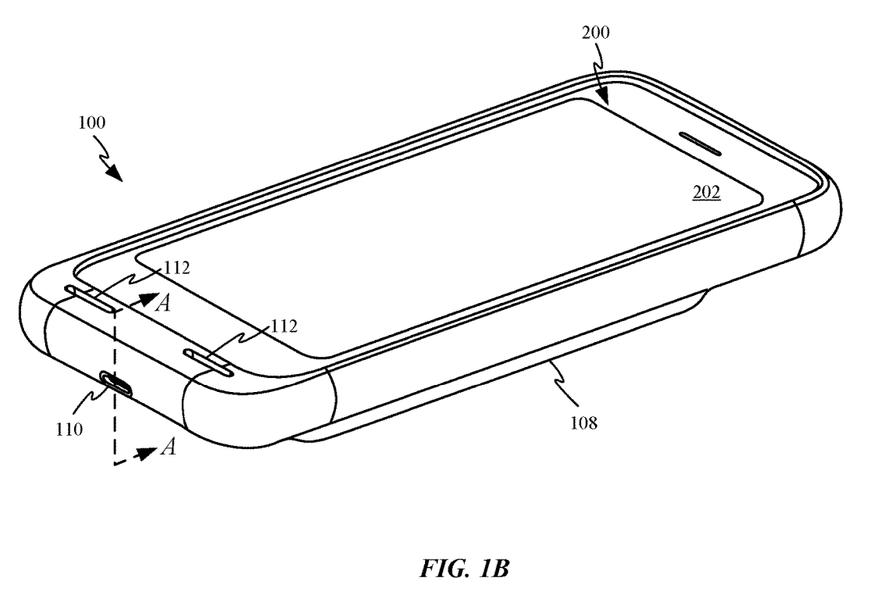
FIG. 1B shows a perspective view of the electronic device case with an electronic device positioned therein.

FIG. 1B shows a perspective view of electronic device case 100 with an electronic device 200 inserted therein. Electronic device 200 can include a display 202 for presenting content to a user. Electronic device 200 can also include a speaker situated proximate one or both of audio ports 112. Electronic device case 100 can be formed from polymeric materials. In some embodiments, polymeric portions of electronic device case 100 proximate regions of electronic device 200 known to be more prone to heating are doped with thermally conductive material to increase the thermally conductivity of those portions of electronic device case 100.

Figure 2:
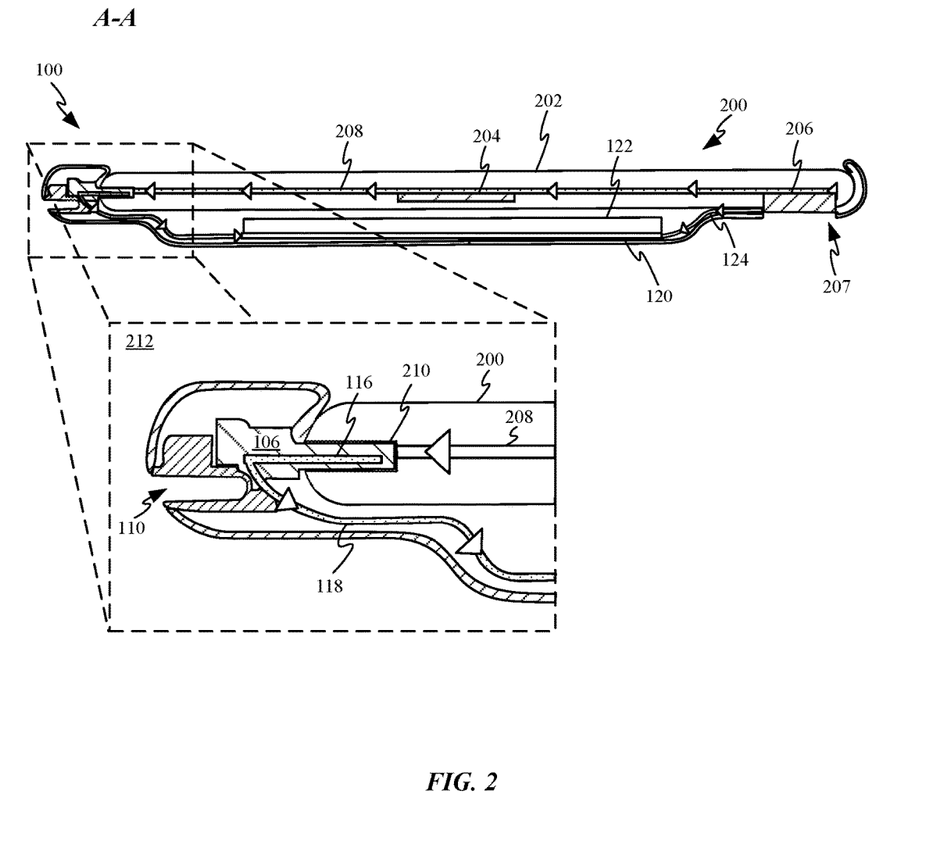
FIG. 2 shows a cross-sectional view of the electronic device case with the electronic device positioned therein.

FIG. 2 shows a cross-sectional view of electronic device case 100 with electronic device 200 inserted therein. Electronic device 200 includes a number of heat emitting components. Two of the components likely to emit large amounts of heat are processor 204 and camera module 206. Electronic device 200 can include thermally conductive pathway 208, which can spread heat from processor 204 and camera module 206 to connector receptacle 210. In some embodiments, thermally conductive pathway 208 can take the form of a sheet of thermally conductive material shaped to avoid obstructions within electronic device 200. In some embodiments, the sheet of thermally conductive material can take the form of a pyrolytic graphite sheet, which has excellent in-plane heat transfer properties.

FIG. 2 also features close up view 212 of one end of electronic device case 100. Close up view 212 shows connector plug 106 engaged within connector receptacle 210. Connector plug 106 includes a thermally conductive core 116. Thermally conductive core 116 can take the form of a data connector assembly that is configured to transfer power and/or data signals to electrical component 122 as well as draw the heat received by connector plug 106 along a thermally conductive pathway 118 of the data connector assembly to a thermally conductive plate 120. Thermally conductive pathway 118 can be a thermally conductive substrate configured to channel heat to a heat spreader such as thermally conductive plate 120. Thermally conductive plate 120 can take the form of a copper plate or stack of graphite sheets in some embodiments. Thermally conductive plate 120 can help improve the efficiency of electronic device case 100 and electronic device 200 by radiating heat away from electronic device case 100. In some embodiments, thermally conductive plate 120 can help dissipate heat from an electrical component 122 positioned adjacent to thermally conductive plate 120.

FIG. 2 also shows a secondary thermally conductive pathway 124, which can be configured to couple with a lateral surface of camera module 206. This can be particularly effective when a windowed opening 207 for camera module 206 is in direct contact with the lateral surface of camera module 206. In some embodiments, the second thermally conductive pathway 124 can extend all the way around windowed opening 207. This configuration could also help distribute heat received from electronic device 200 more evenly across thermally conductive plate 120, since heat received at connector plug 106 is received at the opposite side of thermally conductive plate 120. Thermally conductive pathway 124 can take the form of a thermally conductive material, such as copper, embedded within electronic device case 100 and extending between camera module 206 and thermally conductive plate 120 as depicted.

Figure 3A:
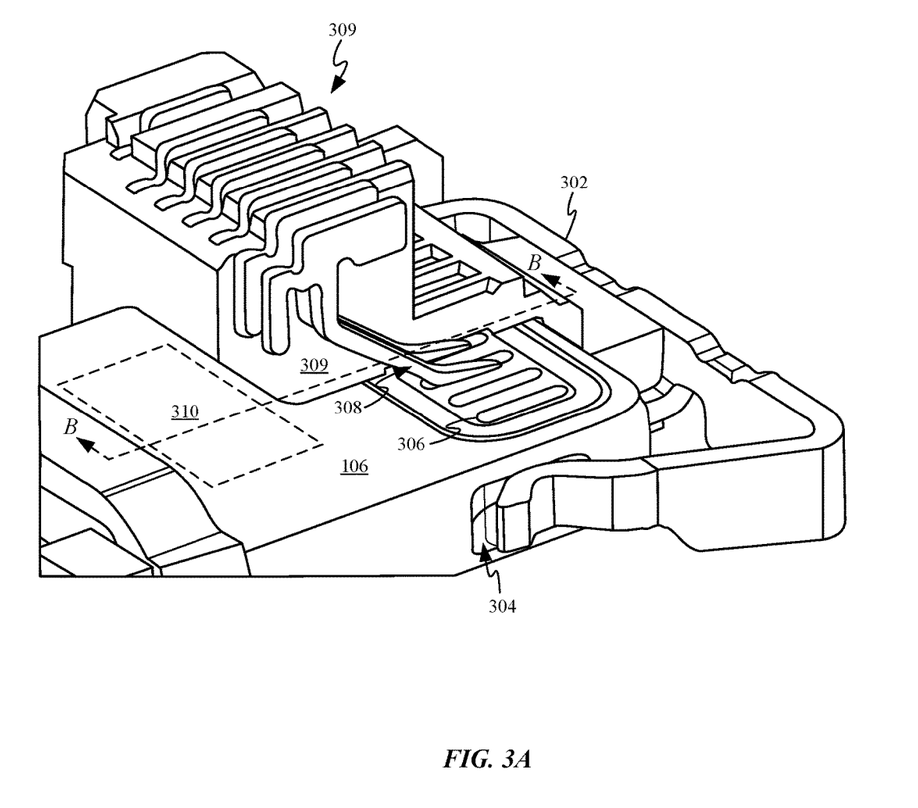
FIG. 3A shows a perspective view of a connector plug of the electronic device case engaged with components of a connector receptacle of the electronic device.

FIG. 3A shows a perspective view of connector plug 106 engaged with components of connector receptacle 210. Retaining clip 302 of connector receptacle 210 is configured to engage detents 304 defined by opposing surfaces of connector plug 106. In some embodiments, thermally conductive core 116 can extend near the exterior surface material within detents 304 or in some embodiments extend to the surfaces defining detents 304 in order to improve the thermal coupling between retaining clip 302 and connector plug 106. Thermally conductive pathway 208 can be coupled directly to retaining clip 302 so that heat from within electronic device 200 can be efficiently coupled to thermally conductive core 116 of connector plug 106. An electrical component of connector receptacle 210 can be configured to contact and transmit signals to surface contacts 306 of connector plug 106 using spring pins 308. In generally, heat is transferred through retaining clip 302 while electrical component 304 functions primarily to exchange data and/or power with connector plug 106. Spring pins 308 can be held in position by connector body 309, a portion of which has been removed to more clearly depict a size and shape of spring pins 308.

In some embodiments, connector receptacle can include an additional component configured to contact region 310 of connector plug 106. In some embodiments, region 310 of connector plug 106 can rise to contact a portion of connector receptacle 210. In some embodiments, an arm of connector receptacle 210 can be lowered to engage region 310 of connector plug 106. This contact can enhance the thermal coupling between connector receptacle 210 and connector plug 106. It should be noted that additional points of contact between connector receptacle 210 and connector plug 106 can be established to further improve the thermal coupling between connector plug 106 and connector receptacle 210.

Figure 3B:
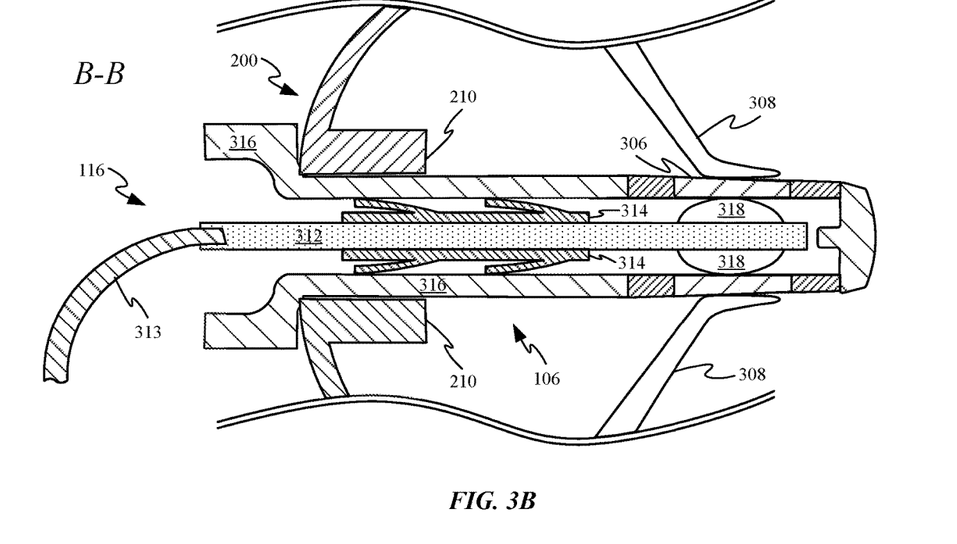
FIG. 3B shows a cross-sectional side view of the connector plug depicted in FIG. 3A engaged within a connector receptacle of an electronic device in accordance with section line B-B.

FIG. 3B shows a cross-sectional side view of connector plug 106 engaged within a connector receptacle 210 of electronic device 200 in accordance with section line B-B. FIG. 3B also depicts an embodiment of thermally conductive core 116 in detail. A rigid PCB 312 of thermally conductive core 116 is disposed within an interior volume defined by receptacle 210, as depicted, and formed around a first end of flexible circuit portion 313, which extends toward other components within electronic device case 100. In some embodiments, the material making up rigid PCB 312 can be molded around flexible circuit portion 313. Rigid PCB 312 can be formed from a glass resin such as FR4 while flexible circuit portion 313 can include electrically and thermally conductive pathways arranged within one or more polyimide layers. Grounding springs 314 thermally couple rigid PCB 312 to grounding ring 316 of connector plug 106. In this way, heat from receptacle 210 can be propagated through grounding ring 316 and grounding springs 314 prior to propagating along thermally conductive core 116. In some embodiments, receptacle 210 can be elongated and grounding springs 314 made more robust to provide a more thermally conductive pathway for heat to cross an interface between receptacle 210 and connector plug 106. For example, receptacle 210 can be elongated so as to extend across a larger area of connector plug 106. Heat generated by electronic device 200 can also be transferred to thermally conductive core 116 through spring pins 308, surface contacts 306 and internal contacts 318. Spring pins 308 are also responsible for transferring information and/or power between electronic device 200 and electronic device case 100.

Figure 3C:
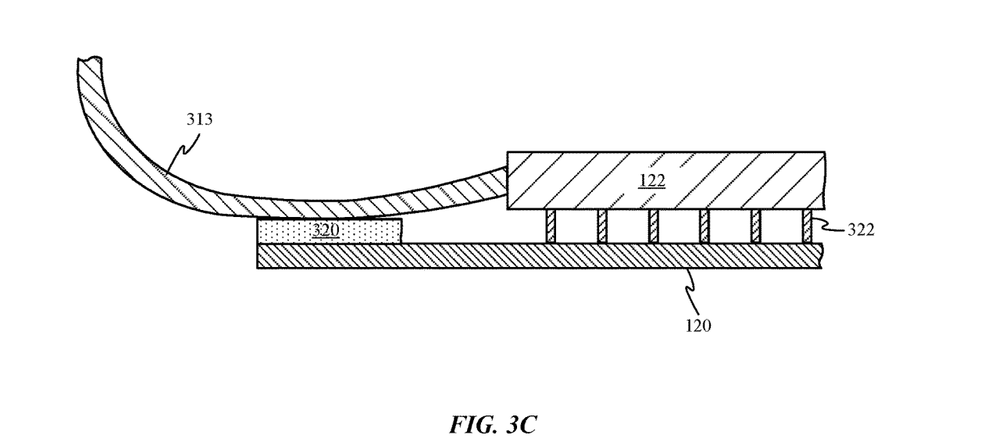
FIG. 3C shows a second end of a flexible circuit being coupled to a thermal pad and to an electrical component.

FIG. 3C shows a second end of flexible circuit portion 313 being coupled to thermal pad 320 and to electrical component 122. Thermal pad 320 puts flexible circuit portion 313 in direct thermally conductive contact with thermally conductive plate 120 by conducting heat directly from flexible circuit portion 313 to thermally conductive plate 120. As discussed above, thermally conductive plate is then able to spread and dissipate the heat received from flexible circuit portion 313. Flexible circuit 313 also carries power and/or data to electrical component 122. In some embodiments, heat from electrical component 122 is able to flow through flexible circuit portion 313 and through thermal pad 320 into thermally conductive plate 120. In embodiments where electrical component 122 generates substantial amounts of heat, electrical component 122 can have one or more discrete thermally conduct pathways 322 moving directly from electrical component 122 to thermally conductive plate 120, as depicted. In some embodiments, electrical component 122 could be in direct contact with thermally conductive plate 120.

Figure 3D:
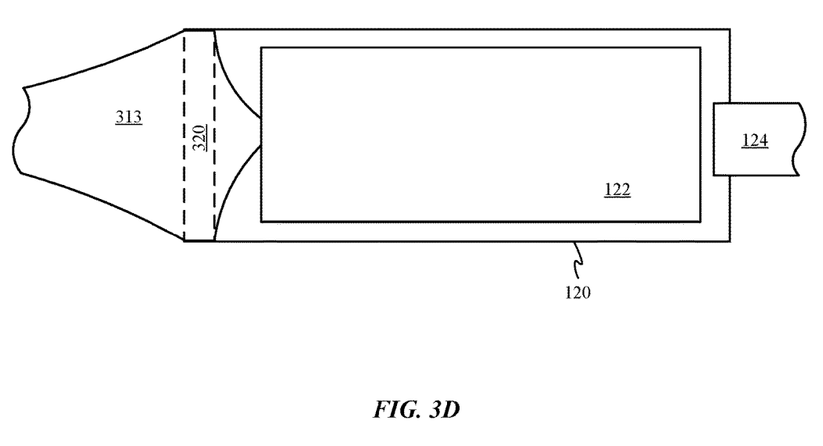
FIG. 3D shows a top view of the electrical component depicted in FIG. 3C, a thermally conductive plate and thermally conductive pathways configured to transfer heat to the thermally conductive plate.

FIG. 3D shows a top view of electrical component 122, thermally conductive plate 120 and thermally conductive pathways configured to transfer heat to thermally conductive plate 120. In particular, flexible circuit portion 313 is shown broadening as it approaches thermal pad 320. By broadening flexible circuit portion 313 the resistance to heat transfer to thermal pad 320 can be substantially reduced, thereby increasing the amount of heat that can be transferred to thermally conductive plate through thermal pad 320. As depicted, thermal pad 320 can extend entirely across a width of thermally conductive plate 120. The width of flexible circuit portion 313 can then taper as it approaches electrical component 122 to discourage the flow of heat directly into electrical component 122. In some embodiments, flexible circuit portion 313 can include one or more thermally conductive layers that include pyrolytic graphite sheets to improve the thermal conductivity of flexible circuit 313. The thermally conductive layers can terminate at thermal pad 320 to discourage heat from electrical plug bypassing thermal pad 320 and continuing to electrical component 122. FIG. 3D also shows thermally conductive pathway 124 terminating at thermally conductive plate 120. Thermally conductive pathway 124 can be configured to deliver heat generated by camera module 206 to thermally conductive plate 120.

Figure 4:
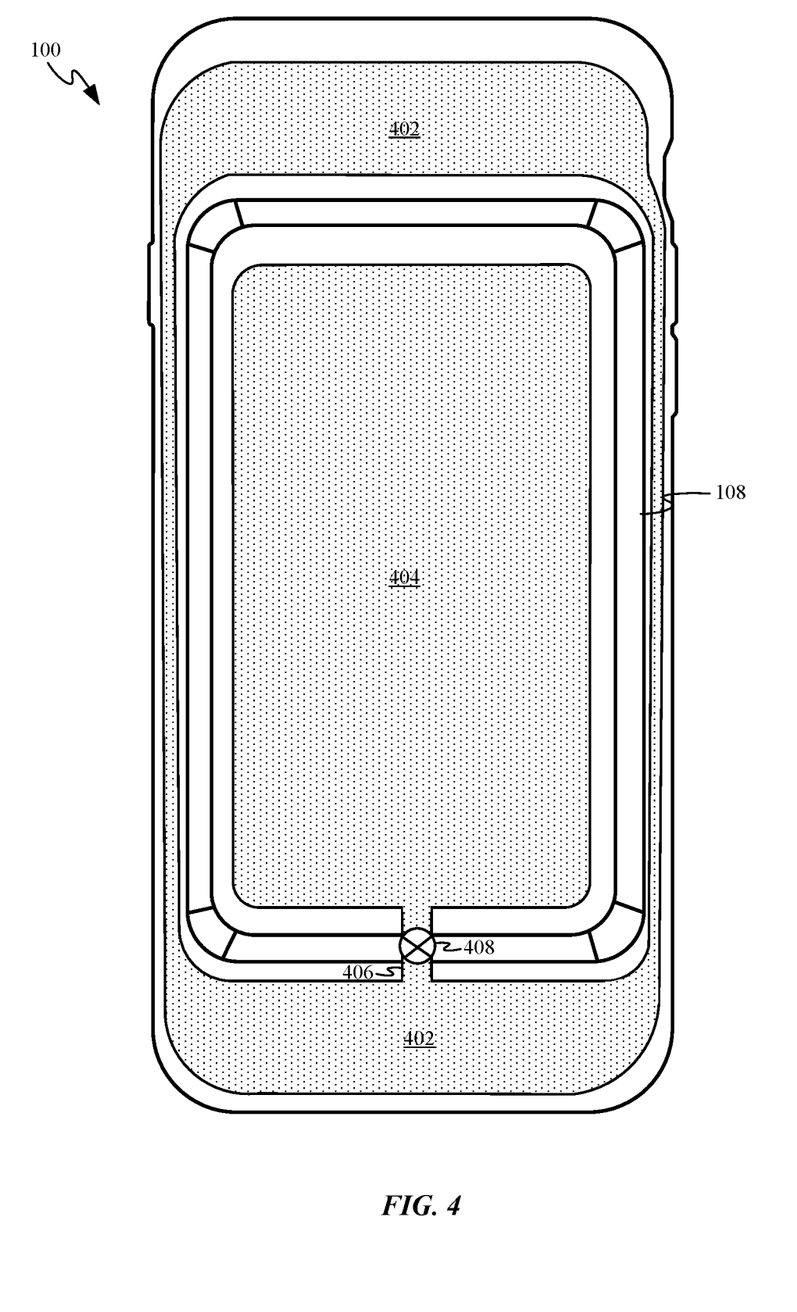
FIG. 4 shows a back view of the electronic device case with multiple thermal dissipation zones.

FIG. 4 shows a back view of electronic device case 100. In some embodiments, electronic device case 100 can have different heat dissipation zones. For example, heat dissipation zone 402 can take the form of a heat spreader or thermally conductive plate configured to receive heat from an electronic device disposed within electronic device case 100. As depicted heat dissipation zone 402 surrounds protrusion 108 and can spread heat evenly across the rear surface of electronic device case 100. Heat dissipation zone 402 can also be configured to spread heat to heat dissipation zone 404 using thermally conductive pathway 406, which can also include a heat spreader or thermally conductive plate formed from thermally conductive material such as copper or pyrolytic graphite sheets. While only a single thermally conductive pathway is shown joining the heat dissipation zones it should be appreciated that any number of thermally conductive pathways can extend between the heat dissipation zones. In some embodiments, one or more of the thermally conductive pathways can be closed by an electromechanical relay 408. The electromechanical relay can be configured to shift a portion of thermally conductive pathway 406 to create an air gap, or slide thermally insulating material into the portion of thermally conductive pathway 406. In this way, heat transfer between the heat dissipation zones can be substantially curtailed. A processor of electronic device case 100 can be configured to adjust the flow of heat between heat dissipation zones 402 and 404 for any number of reasons. For example, when protrusion 108 contains a battery cell, heat transfer between the heat dissipation zones can be severed when it is undesirable to transfer heat from the electronic device to the battery positioned within protrusion 108. This could be the case where the battery within protrusion 108 is operating above safe operating temperatures.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling operation of the electronic device case and/or communication between the electronic device case and an electronic device disposed therein. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device case, comprising:
   a bottom wall and sidewalls that cooperate to define a recess suitable for receiving an electronic device and a front opening through which an electronic display of the electronic device is viewable;
   an electrical component embedded within the bottom wall;
   a connector plug protruding from one of the sidewalls and into the recess, the connector plug being configured to establish a communication channel between the electronic device and the electrical component;
   a heat-spreading component embedded within the bottom wall and configured to distribute heat received from the connector plug across the bottom wall; and
   a data connector assembly electrically coupling the connector plug to the electrical component, the data connector assembly comprising:
   a thermally conductive substrate having a first end in thermally conductive contact with the connector plug and a second end opposite the first end thermally coupled to the heat-spreading component.

2. The electronic device case as recited in claim 1, wherein the heat-spreading component is a copper plate.

3. The electronic device case as recited in claim 1, wherein the heat-spreading component comprises a pyrolytic graphite sheet.

4. The electronic device case as recited in claim 1, further comprising thermally conductive strips arranged along interior facing surfaces of the sidewalls, wherein the sidewalls are configured to compress the thermally conductive strips against lateral surfaces of the electronic device.

5. The electronic device case as recited in claim 1, wherein the electrical component is a battery.

6. The electronic device case as recited in claim 1, wherein the second end of the thermally conductive substrate is wider than the first end of the thermally conductive substrate.

7. The electronic device case as recited in claim 1, further comprising a thermally conductive pad that puts the thermally conductive substrate in direct thermal contact with the heat-spreading component and extends across one side of the heat-spreading component.

8. The electronic device case as recited in claim 1, wherein a first end of the data connector assembly comprises a rigid printed circuit board (PCB) disposed within an interior volume defined by a hollow body of the connector plug.

9. A protective case, comprising:
   a bottom wall and sidewalls that cooperate to define a recess suitable for receiving and allowing user interaction with an electronic device having an electronic display;
   a battery embedded within the bottom wall;
   a connector plug protruding from one of the sidewalls and into the recess, the connector plug being configured to electrically couple the electronic device and the battery;
   a heat-spreading component embedded within the bottom wall and configured to distribute heat received from the connector plug across the bottom wall; and
   a flexible circuit extending from the connector plug to the heat-spreading component and from the heat-spreading component to the battery.

10. The protective case as recited in claim 9, wherein a portion of the bottom wall defines an opening extending therethrough for accommodating a camera module of the electronic device.

11. The protective case as recited in claim 10, wherein a thermally conductive pathway is embedded within a portion of the bottom wall and is configured to contact a protruding portion of the camera module.

12. The protective case as recited in claim 11, wherein the thermally conductive pathway extends around the opening and to the heat-spreading component.

13. The protective case as recited in claim 9, wherein the heat-spreading component is disposed between the battery and an exterior surface of the bottom wall.

14. The protective case as recited in claim 9, further comprising an electromechanical relay configured to control a distribution of heat across the bottom wall.

15. The protective case as recited in claim 9, wherein a first portion of the bottom wall contains the battery and protrudes farther than a second portion of the bottom wall.

16. The protective case as recited in claim 9, wherein the flexible circuit is configured to transfer heat received at the connector plug to the heat-spreading component and deliver power from the battery to the electronic device.

17. An electronic device case, comprising:
a bottom wall and sidewalls that cooperate to define a recess suitable for receiving an electronic device;
a battery embedded within the bottom wall;
a connector plug protruding from one of the sidewalls and into the recess, the connector plug being configured to electrically couple the electronic device to the battery when the electronic device is disposed within the recess;
a heat-spreading component embedded within the bottom wall and configured to distribute heat received from the connector plug across the bottom wall; and
a data connector assembly electrically coupling the connector plug to the battery, the data connector assembly comprising:
a rigid printed circuit (PCB) disposed within the connector plug; and
a flexible circuit having a first portion embedded within the rigid PCB, a second portion thermally coupled to the heat-spreading component, and a third portion electrically coupled to the battery.

18. The electronic device case as recited in claim 17, wherein the rigid PCB is thermally coupled to the connector plug using grounding springs and electrical contacts.

19. The electronic device case as recited in claim 17, wherein the flexible circuit comprises a pyrolytic graphite sheet that increases the thermal conductivity of the flexible circuit.

20. The electronic device case as recited in claim 17, wherein the second portion of the flexible circuit is wider than the first portion and the third portion.

* * * * *